United States Patent [19]
Maxwell et al.

[11] Patent Number: 5,996,353
[45] Date of Patent: Dec. 7, 1999

[54] SEMICONDUCTOR PROCESSING SYSTEM WITH A THERMOELECTRIC COOLING/HEATING DEVICE

[75] Inventors: Kenneth Maxwell, Austin, Tex.; Julio Aranovich, Palo Alto, Calif.

[73] Assignee: Applied Materials, Inc., Santa Clara, Calif.

[21] Appl. No.: 09/082,845

[22] Filed: May 21, 1998

[51] Int. Cl.$^6$ .................................................. F24B 21/02
[52] U.S. Cl. ........................................... 62/3.2; 62/259.2
[58] Field of Search ................................ 62/3.2, 3.3, 3.7, 62/259.2, 331

[56] References Cited

U.S. PATENT DOCUMENTS

| | | | |
|---|---|---|---|
| 3,719,052 | 3/1973 | White | 62/3.2 |
| 5,029,445 | 7/1991 | Higgins | 62/3.2 |
| 5,061,630 | 10/1991 | Knopf et al. | 435/290 |
| 5,134,436 | 7/1992 | Fujioka | 355/30 |
| 5,154,661 | 10/1992 | Higgins | 62/3.3 |
| 5,269,146 | 12/1993 | Kerner | 62/3.6 |
| 5,450,726 | 9/1995 | Higgins | 62/3.3 |
| 5,522,215 | 6/1996 | Matunaga et al. | 62/3.2 |
| 5,613,364 | 3/1997 | Higgins | 62/3.2 |
| 5,667,622 | 9/1997 | Hasegawa et al. | 156/345 |
| 5,671,117 | 9/1997 | Shersfinsky et al. | 361/234 |
| 5,728,253 | 3/1998 | Saito et al. | 156/345 |
| 5,740,016 | 4/1998 | Dhindsa | 361/704 |
| 5,802,856 | 9/1998 | Schaper et al. | 62/3.7 |

OTHER PUBLICATIONS

Noah Precision, Inc., "Thermoelectric Temperature Control" Brochure.
"Thermoelectric Cooling Systems Design Guide", Marlow Industries, Inc., Dallas, Texas, 1994.
Thermoelectric Products, Marlow Industries, Inc., Dallas, Texas, 1992.
A. Buchel, editor, "Series 65 Pendulum Control & Isolation Valve", VAT Vakuumventile AG, CH –9469, Haag, Schweiz, 1996, pp. 1, 5–7.
A. Buchel, editor, "S65 Pendulum Control & Isolation Valve", VAT Vakuumventile AG CH–9469, Haag, Schweiz, 1996, p. 1.
A. Buchel, editor, "Series 65 Pendulum Control & Isolation Valve ", VAT Vakuumventile AG CH–9469, Haag, Schweiz, 1996, p.
A. Buchel, editor, "Series 65 Pendulum Control & Isolation Valve", VAT Vakuumventile AG, Ch–9469, Haag, Schweiz, 1996, p. 3.
A. Buchel, "Control Characteristics S65DNM 100/DN250" and "S65 Valve; Pressure/Flow Range", 1996, p. 1.
Particle Measurement Serie 65BN200, test 35.xls and 36.xls.
"Pendulum Valve Control System VAT Series 65", VAT Vakuumventile AG, Ch–9469, Haag, Switzerland, pp. 144–151.
Noah Precision, Inc., "Peltier Effect", various tables.

*Primary Examiner*—William Doerrler
*Attorney, Agent, or Firm*—Thomason, Moser Patterson

[57] ABSTRACT

The invention provides an apparatus for controlling a temperature of a component of a processing system comprising one or more thermoelectric devices disposed in thermal conduction with the component and a thermal fluid passage disposed in thermal conduction with the thermoelectric device. To regulate the temperature of the component, the thermoelectric device is connected to an electrical power, and a thermally conductive fluid is flowed through the thermal passage. The invention further provides an apparatus for removing particles comprising one or more thermoelectric devices disposed on a gas exhaust line. To remove particles from a processing system, the thermoelectric devices are connected to an electrical power source to create a cold trap within the gas exhaust on which particles condense.

31 Claims, 4 Drawing Sheets

SEMICONDUCTOR PROCESSING SYSTEM WITH A THERMOELECTRIC COOLING/HEATING DEVICE

BACKGROUND OF THE INVENTION

1. Field of the Invention

Generally, the present invention relates to heat transfers in semiconductor processing systems. More specifically, the present invention relates to the application of thermoelectric devices for heating and cooling various components, structures or surfaces in a semiconductor processing system.

2. Background of the Related Art

A processing system generally comprises a plurality of process chambers having differing requirements for heating and/or cooling certain components or structures because individual components or structures within or attached to a process chamber reach an undesirable temperature under a variety of conditions, causing improper processing on substrates. Generally, because the temperature of the substrate affects the processing results on the substrate, it is important to maintain the temperature of the substrate within a desirable range for proper processing. Particularly, in an etch chamber where a process gas, such as argon, bombards the substrate and generates heat on the substrate, the temperature increase of the substrate must be controlled because the substrate has a thermal budget that must not be exceeded. When the thermal budget of the substrate has been exceeded, such as by heating the substrate above a particular temperature, improper processing results on the substrate, and device failure occurs.

An example of a component of a process chamber having both a cooling and a heating requirement is an electrostatic chuck (E-chuck) for holding a substrate in place during processing. Usually, the E-chuck physically contacts the substrate and the temperature of the substrate is affected by the temperature of the E-chuck. Thus, it is important to control the temperature of the E-chuck because the temperature of the substrate usually affects the processing results. Likewise, the temperatures of other components and structures of the processing chamber, such as valves, also need to be controlled because some processes exhibit optimum performance only at specific and/or narrow temperature ranges.

Another problem associated with temperature control is that temperature changes of the process chamber and/or its components may cause some deposited particles to be released back into the process chamber or some material on or in the substrate to flow or migrate, resulting in a defective circuit or other structures formed on the substrate. Thus, there is a need to remove these particles from the process chamber to prevent contamination on the substrates. Additionally, a lack of temperature control may cause a degradation of the process chamber walls or components.

In an attempt to control the temperature of the E-chuck, a fluid is flowed through a small chamber or channel in or under the E-chuck. The fluid is heated or cooled in a remote heat exchanger unit disposed externally and remotely from the process chamber. The same fluid may heat or cool the E-chuck depending on the temperature of the fluid released by the heat exchanger unit. However, this temperature management technique responds slowly to temperature changes at the E-chuck because the temperature of the fluid is measured at the heat exchanger and the corrective actions take place at the heat exchanger, remotely from the E-chuck.

Other attempts to control the temperatures of the components of a processing system use remote thermal electric heat exchangers. A thermoelectric (TE) device transfers heat according to the Peltier effect. When a current is passed through a junction of two dissimilar conductors, the Peltier effect causes a temperature change that is proportional to the current through the junction. One end of the conductor becomes cold while the other end of the conductor becomes hot. This well-known principle can produce temperature differentials of up to 100° F. and can cool the cold end of the conductor even below the freezing point of water. One example of a TE device is the DuraTEC available from Marlow Industries, Inc., Dallas, Tex. A TE device may be used with a fluid to flow heat to or from a remote object, so the TE device can heat or cool the object remotely, as in a heat exchanger. Examples of such uses are described in the following United States Patents.

U.S. Pat. No. 5,613,364 describes a temperature control module for heating or cooling part or all of the interior of a process module. The temperature control module is mounted on the exterior of the process module and has a thermoelectric heat exchanger assembly, remote from the internal space of the process module, using a dielectric liquid that flows in and out of the process module to cool or heat the inside of the process module. The temperature control module also has a temperature sensor for sensing the temperature of the dielectric liquid as the liquid flows into the temperature control module, thereby indicating the temperature in the process module.

U.S. Pat. No. 5,154,661 describes a thermal electric cooling system for cooling a wafer chuck or a developer cooling tank. The thermal electric cooling system is located remotely from the wafer chuck or the developer cooling tank. The thermal electric cooling system includes a cooling reservoir for cooling a coolant fluid that circulates to the wafer chuck or developer cooling tank. A temperature sensor is located in the cooling reservoir for providing feedback regarding the temperature of the coolant fluid, so that a controller can adjust an array of thermal electric cooler cells to maintain the coolant fluid at a particular temperature.

U.S. Pat. No. 5,029,445 describes a thermal electric cooling system for maintaining a predetermined liquid temperature in a liquid bath in a wet process station for processing semiconductor wafers. The thermal electric cooling system is located remotely from the liquid bath and the wet process station. The thermal electric cooling system has an inlet and an outlet for circulating cooled liquid to the wet process station. The thermal electric cooling system also has a heater for heating the liquid after it has been cooled by the thermal electric cooler to raise the liquid temperature to a desired level. The temperature of the heater is sensed by a thermistor to provide temperature feedback to a controller.

U.S. Pat. No. 5,450,726 describes a thermal electric air cooling apparatus for use with climate or environmental control systems in the semi-conductor and other industries. As in the previously described cooling systems, the thermal electric air cooling apparatus is located remotely from the structure or space which it cools. An inlet and an outlet permit the air to circulate to and from the thermal electric air cooling apparatus. A heater may heat the air, so that the combined performance of the heater and the cooling apparatus can maintain the temperature of the air at a desired temperature. A thermocouple detects the temperature of the air at the outlet from the thermal electric air cooling apparatus to provide temperature feedback to a controller.

However, the applications for TE devices described above are inefficient for heating or cooling structures within a semiconductor processing system because they are located remotely from the part being heated and/or cooled. Considerable heat loss or gain may occur between the heat exchanger and the structure, resulting in a less than optimum usage of the TE device's heat transfer capability. Additionally, since the TE device is disposed remotely from the structure, there is a built-in delay in the response time of the TE device to the changes in temperature at the component of the processing system. Furthermore, a coolant fluid flowing from a remote heat exchanger into the processing system and around or near the structure to exchange heat with the structure exhibits a temperature variation or gradient along its flow path, so the structure is not cooled or heated uniformly.

Therefore, a need exists for a processing system that provides a more exacting control and a faster response to temperature variations in particular components of the processing system. It would be desirable if the processing system has a better heat transfer capacity at the heated component to allow immediate correction to temperature variations. There is also a need for a system that removes contaminant particles from the process chamber to prevent contamination on the substrates.

SUMMARY OF THE INVENTION

The invention provides an apparatus for controlling a temperature of a component of a processing system comprising one or more thermoelectric devices disposed in thermal conduction with the component and a thermal fluid passage disposed in thermal conduction with the thermoelectric device. To regulate the temperature of the component, the thermoelectric device is connected to an electrical power source, and a thermally conductive fluid is flowed through the thermal passage. Preferably, the thermal fluid is cooled or heated in the thermal fluid supply to enhance the heat transfer between the component and the thermoelectric devices. Furthermore, one or more temperature sensors are provided on a surface of the component to allow quick responses to temperature variations by varying the power delivered to the thermal electric devices and/or the temperature of the thermal fluid flowing through the thermal fluid passage. Examples of components contemplated by the invention include an electrostatic chuck and a chamber wall.

The invention further provides an apparatus for removing particles comprising one or more thermoelectric devices disposed on an exhaust line or components, such as valves, disposed therealong. To remove particles from a processing system, the thermoelectric devices are connected to an electrical power to create a cold trap within the gas exhaust line on which particles condense and can be removed. Preferably, a cold trap grid or heat sink fins are connected to the cold side of the thermoelectric devices to maximize areas of condensation for the particles in the gas flowing therethrough.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The applications described below for thermoelectric (TE) devices in processing systems provide an increased heat transfer rate at the source of the heat or at the location of the need for the heat, an increased heat transfer efficiency, an improved response time to temperature changes and a uniform heat transfer across the length of the cooled/heated object. In addition, the invention provides for removal of some particles from the gases in the processing system using TE devices.

Figure 1:
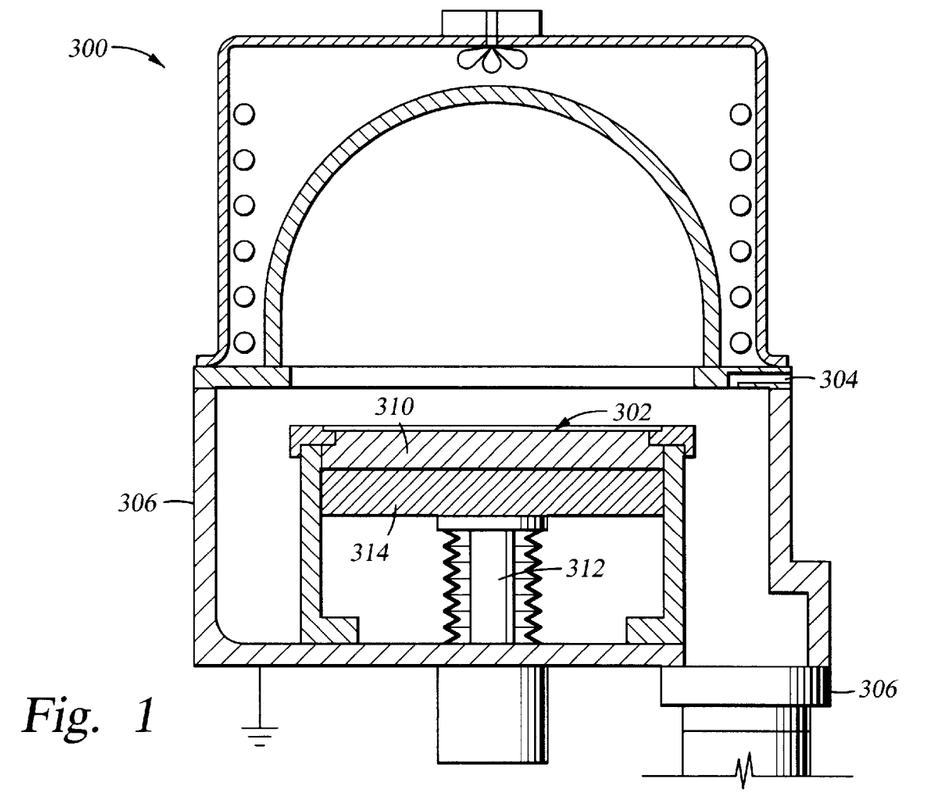
FIG. 1 is a schematic side view of a simplified etch chamber having an E-chuck disposed therein.

FIG. 1 shows a schematic side view of a simplified etch chamber having an E-chuck disposed therein. Generally, the etch chamber 300 comprises a chamber enclosure 306, a substrate support member 302, a processing gas inlet 304 and an outlet pump 306. The substrate support member 302 is disposed in a lower portion of the chamber and typically comprises an electrostatic chuck (E-chuck) 310 and a base member 314. The E-chuck 310 generally comprises a conduction electrode having a ceramic insulation coating, and the base member 314 is typically made of aluminum. A lift assembly 312 is disposed through the bottom of the etch chamber enclosure and engages the substrate support member 302 to lift the substrate support member 302 and the substrate to a processing position. Although the following examples are described with reference to an etch chamber and an E-chuck shown in FIGS. 2–4, it is understood that the invention is not so limited, but may be used with other process chambers, such as a CVD chamber or a PVD chamber, and with other chucks, such as mechanical or magnetic chucks.

Figure 2:
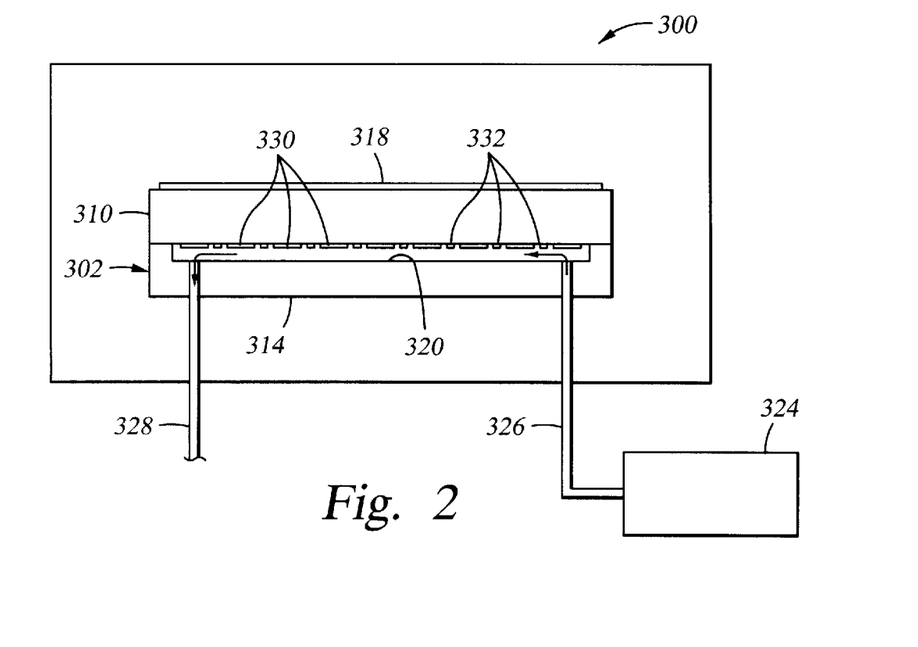
FIG. 2 is a schematic side view of a simplified substrate support member having a TE device of the present invention.

FIG. 2 shows a schematic side view of a simplified substrate support member 302 having a TE device of the present invention. The substrate support member 302 generally comprises an E-chuck 310 mounted on a base member 314. During processing, a substrate 318 is disposed on a top surface of the E-chuck 310, and the backside of the substrate 318 is generally in complete contact with the top surface of the E-chuck 310. Alternatively, a plurality of small supports (not shown) disposed on the top surface of the E-chuck 310 separates the substrate 318 from the top surface of the substrate support member 302, preferably by about 1 mm from the E-chuck 310, to minimize physical contact that may produce contaminants. A recessed upper surface of the base member 314 and a lower surface of the E-chuck define a heat transfer chamber 320. A thermal fluid, such as water, helium or propylene glycol, flows from a thermal fluid source 324, through an inlet conduit 326 into the heat transfer chamber 320. The thermal fluid then flows out of the heat transfer chamber 320 through an outlet conduit 328 back to the thermal fluid source. The thermal fluid source 324 may also include a heat exchanger wherein the thermal fluid is cooled or heated before being circulated into the heat transfer chamber 320. When the substrate 318 and/or the E-chuck needs to be cooled, the heat generated by the process on the substrate 318 and the E-chuck 310 transfers into the thermal fluid in the heat transfer chamber 320 to be transferred out of the process chamber 300. Alternatively, when the E-chuck 310 or the substrate 318 needs to be heated, the thermal fluid is heated at the thermal fluid source 324 to transfer heat into the heat transfer chamber 320.

An array of TE devices 330 are disposed within the heat transfer chamber 320 for enhancing the conduction of heat from the E-chuck 310 to the thermal fluid or vice versa. When the TE devices are used to cool the E-chuck 310, an electrical current is provided to the TE devices 330 to create a cold side toward the E-chuck 310 and a hot side toward the heat transfer chamber 320. A cooled thermal fluid flows from the thermal fluid source 324 into the heat transfer chamber 320 to cool the hot side of TE devices 330. As the hot side of the TE devices 330 is cooled by the thermal fluid, the cold side of the TE devices cools the E-chuck 310 proportionally. In this manner, the TE devices 330 enhances the conduction of heat from the E-chuck 310, thereby increasing the efficiency of the cooling system.

When the TE devices are used to heat the E-chuck 310, an electrical current is provided to the TE devices 330 to create a hot side toward the E-chuck 310 and a cold side toward the heat transfer chamber 320. A heated thermal fluid flows from the thermal fluid source 324 into the heat transfer chamber 320 to heat the cold side of TE devices 330. As the cold side of the TE devices 330 is heated by the thermal fluid, the hot side of the TE devices heats the E-chuck 310 proportionally. Thus, the TE devices 330 enhance the responsiveness of the temperature control system to changes in the temperatures in the substrate support member 302 by actively pumping heat in the direction required.

Preferably, one or more temperature sensors 332, such as thermocouples, are disposed adjacent the TE devices 330 to sense the temperature of the thermal fluid, the base member 314 and/or the E-chuck 310, thereby providing a real-time indication of the temperature at the source of the heat transfer. Alternatively, or additionally, one or more thermocouples are disposed on or adjacent the top surface of the E-chuck 330 to provide a real-time indication of the temperature of the substrate 318. When an array of temperature sensors are disposed in a corresponding arrangement with an array of TE devices, each individual TE device can be adjusted to respond to changes in temperature as sensed by the individual temperature sensors near that particular the TE device. Thus, the TE devices provide individual control over different regions of the E-chuck 310 to even out any temperature gradients across the E-chuck 310. With the temperature sensors 332 and the TE devices 330 both located at the source of the heat transfer, the cooling system is able to respond very quickly to changes in the temperature of the substrate support member 302 and can make immediate changes in the quantity or direction of the heat transfer. Therefore, the temperature of the substrate support member 302 can be very tightly controlled within a narrow temperature range.

In one embodiment as shown in FIG. 2, the TE devices 330 are constructed integrally within the bottom surface of the E-chuck 310. In an alternative embodiment, the TE devices 330 are constructed separately from the E-chuck 310 and are attached to the bottom surface of the E-chuck 310 with a thermally conductive adhesive. In another alternative embodiment, the TE devices 330 may be attached to a surface of the base member 314 in the heat transfer chamber 320 but in thermally conductive contact with a thermally conductive fluid.

Figure 3:
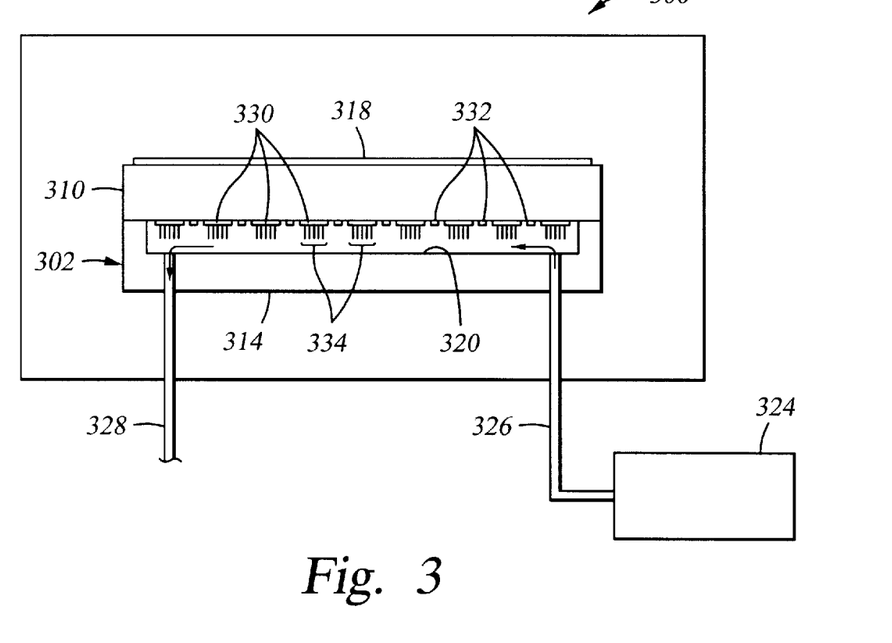
FIG. 3 is a schematic side view of another embodiment of the substrate support member having TE devices attached to heat sink fins extending into a heat transfer chamber.

FIG. 3 discloses another embodiment of the invention, in which the TE devices 330 are provided with heat sink fins 334 extending into the heat transfer chamber 320 to enhance the heat transfer between the TE devices 330 and the thermal fluid. This embodiment further increases the performance of the cooling/heating system by increasing the heat transfer surface area between the TE devices 330 and the thermal fluid.

Figure 4:
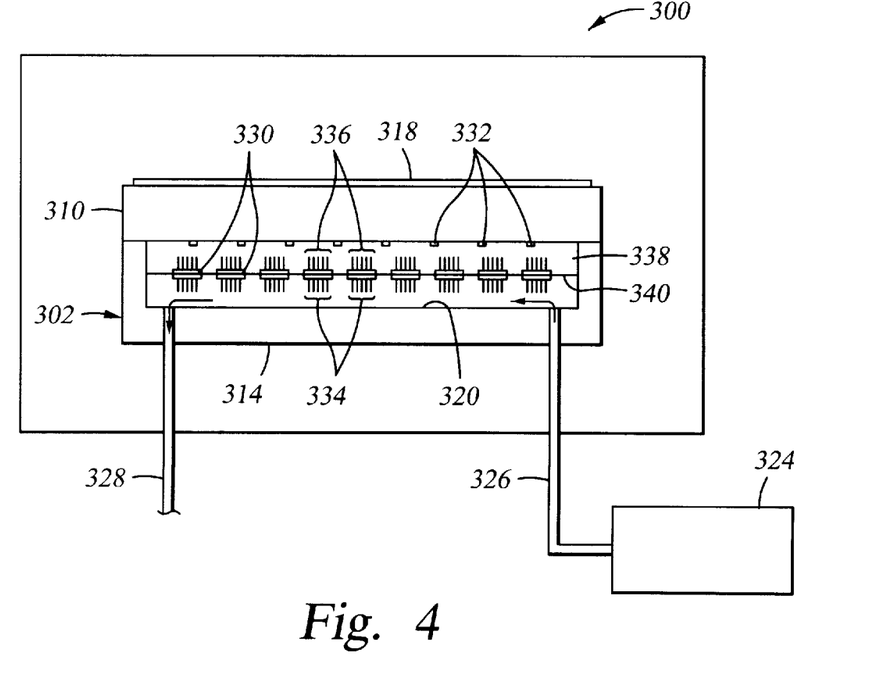
FIG. 4 shows yet another embodiment of the invention wherein the TE devices are placed between two heat transfer chambers within the substrate support member.

FIG. 4 discloses yet another embodiment in which the TE devices 330 are placed between two heat transfer chambers 320, 338 separated by a wall 340. Each TE device includes a first set of heat sink fins 336 extending into an upper heat transfer chamber 338 and a second set of heat sink fins 334 extending into a lower heat transfer chamber 320. Preferably, the temperature sensors 332 are arranged on the bottom surface of the E-chuck 310. The heat transfer chamber 338 contains a thermally conductive fluid for transferring heat between the E-chuck 310 and the heat sink fins 336 of the TE devices 330. Optionally, the thermally conductive fluid in the chamber 338 is set in motion within the heat transfer chamber 338, such as by a fan 342, to provide a uniform heat transfer across the bottom surface of the E-chuck 310. Thus, hot or cold spots and temperature gradients are prevented from occurring on the bottom surface of the E-chuck 310 at the individual location of a TE device 330. Alternatively, a thermal fluid is circulated from a thermal fluid supply (not shown) into the upper heat transfer chamber 338 to enhance the heat transfer between the TE devices 330 and the E-chuck 310.

Removal of Particles

As a result of processing in the system 200, freeborn particles may enter some sections of the system, such as in the vacuum space of one of the process chambers 202. Some of the devices, such as a turbo pump, in or attached to the process chambers 202 are susceptible to damage if any particles come in contact with the components thereon. However, some of these particles may be condensed onto a cool surface within the system, thereby becoming trapped and unable to cause damage. After the particles are trapped by condensation, they can be safely removed from the system. One or more TE devices can be arranged in a relevant space within a passageway in the system 200 to serve as a cold trap, or particle trap, that condenses and removes particles from the passageway. Although, a TE cold trap is described hereinbelow in reference to particular embodiments shown in FIGS. 5–7, it is understood that the invention is not so limited, but also contemplates other readily apparent applications of TE devices to cool and condense particles or gases within any part of a processing system 200.

Figure 5:
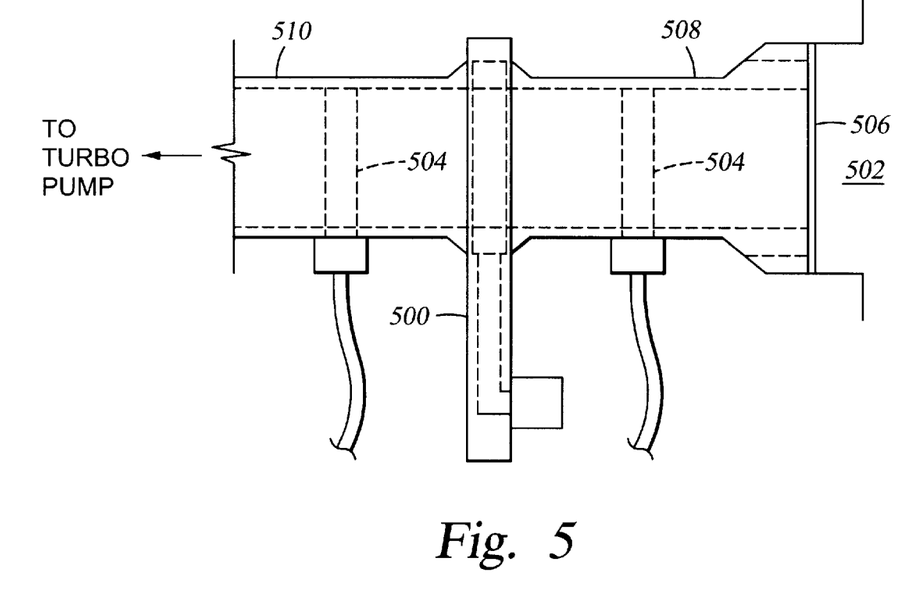
FIG. 5 shows a side view of a valve having a TE cold trap according to the invention between a process chamber and a pump.

FIG. 5 shows a side view of a valve 500 having a cold trap according to the invention disposed between a process chamber 502 and a pump, such as a turbo pump. The region in or near the valve 500 is a preferred location for a cold trap because it is outside of the process chamber 502 and remote from the turbo pump. The valve 500 may be any appropriate type of valve between a process chamber 502 and a turbo pump, such as the Series 65 Pendulum Control and Isolation Valve available from VAT Vakuumventile AG of the Hague, Switzerland. A pump port 506 on the process chamber 502 is attached to a conduit, or passageway, 508, which is in turn attached to the valve 500. The valve 500 is attached to another conduit 510, which is in turn attached to the turbo pump that pumps out gases from the interior of the process chamber 502. Preferably, one or more TE devices 504 are disposed on either or both of the conduits 508, 510 so that the gases and particles that flow therethrough must flow past the cold sides of the TE devices 504. Optionally, the TE devices are also disposed on the valve or the paddle of the valve to provide additional condensation surface. The TE devices 504 are electrically connected to created a cold side within the conduits 508, 510 and a hot side outside the conduits 508, 510. The TE devices 504 draw heat from the interior of the conduits 508, 510 to the exterior thereof, so a cold spot is created at the TE devices 504 to cause particles in the gases to condense onto the TE devices 504. Thus, the particles are removed from the gases before the particles reach the turbo pump.

Figure 6:
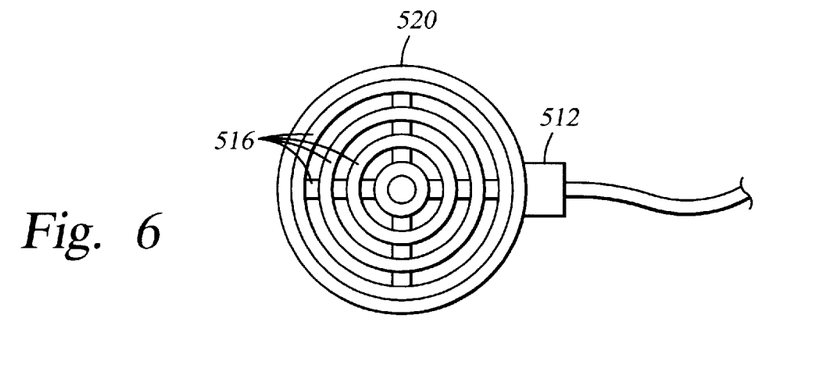
FIG. 6 shows an alternative embodiment of a TE cold trap wherein a TE device is attached to a cold trap grid.
Figure 7:
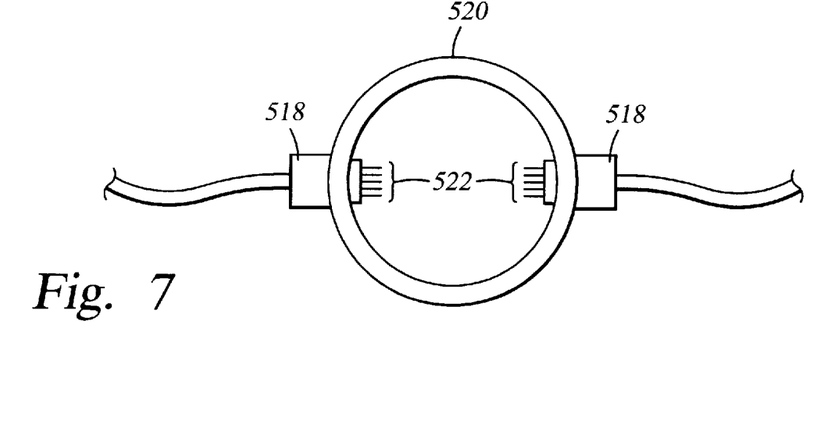
FIG. 7 shows another embodiment of a TE cold trap wherein one or more TE device are attached to one or more heat sink fins.

FIGS. 6 and 7 show alternative embodiments for a TE cold trap. In the embodiment shown in FIG. 6, a TE device 512 is disposed through the sidewall of a conduit 514 and thermal-conductively connected to a cold trap grid 516 disposed within the conduit 514. The cold trap grid 516 permits gases to flow therethrough and provides a large surface area for particles from the gases to condense thereon. In the embodiment shown in FIG. 7, one or more TE devices 518 are disposed through the sidewall of the conduit 520 into the gas flow region of the conduit 520. One or more heat sink fins 522 are attached to the cold sides of the TE devices 518 to maximize the cooling surface area for condensing particles within the gas flow region, thereby enhancing the efficiency of the cold trap.

The System

Figure 8:
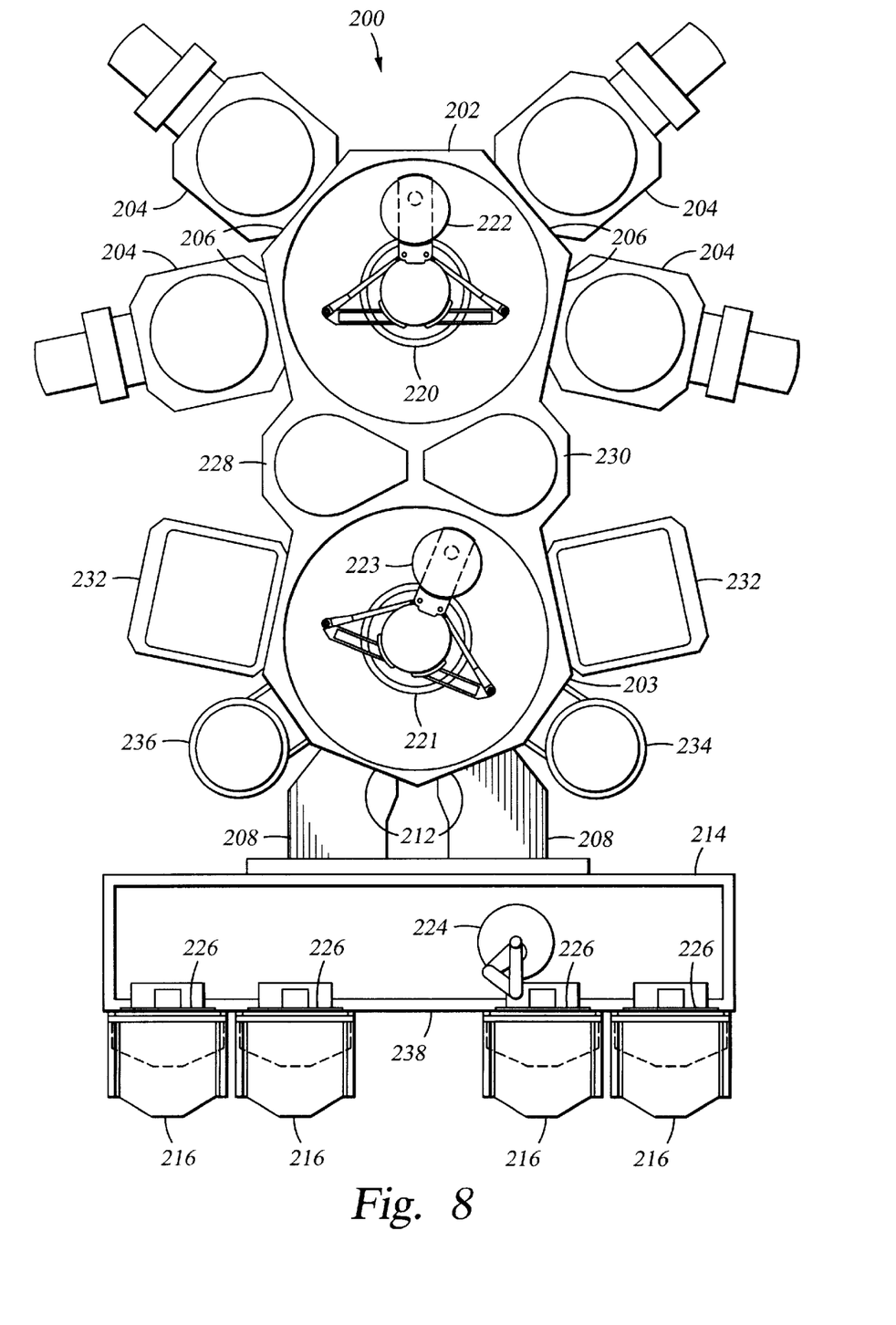
FIG. 8 generally shows a schematic top view of an embodiment of a vacuum processing system 200.

FIG. 8 generally shows a schematic top view of an embodiment of a vacuum processing system 200. The system 200 shown in FIG. 8 is an example of the Endura™ system available from Applied Materials, Inc., Santa Clara, Calif. Although the invention may be practiced with this system 200, it is understood that other types of vacuum processing systems may be used with the present invention, and the present invention is not limited to any particular type of vacuum processing system. The vacuum processing system 200 includes a transfer chamber 202 and a buffer chamber 203 typically mounted on a platform (not shown) and generally forming a system monolith. The system monolith has two load lock chambers 208 mounted at facets 212. An optional mini-environment 214 may attach to the load lock chambers 208 for introducing substrates into the system 200. The transfer chamber 202 is shown with four process chambers 204 mounted at facets 206. The process chambers 204 perform the primary substrate process on the substrates in the vacuum processing system 200. Process chambers 204 may be any type of process chamber, such as a rapid thermal processing chamber, a physical vapor deposition chamber (PVD), a chemical vapor deposition chamber (CVD), an etch chamber, etc.

The process chambers 204 may be supported by the transfer chamber 202 or may be supported on their own platforms depending on the configuration of the individual process chambers 204. Slit valves (not shown) in the facets 206 provide access and isolation between the transfer chamber 202 and the process chambers 204. Correspondingly, the process chambers 204 have openings (not shown) on their surfaces that align with the slit valves.

A pre-clean chamber 228 and a cool-down chamber 230 are disposed between the transfer chamber 202 and the buffer chamber 203. Alternatively, both of the chambers 228, 230 may be bi-directional to transfer substrates in either direction between the transfer chamber 202 and the buffer chamber 203, and one of the expansion chambers 232 may be a pre-clean chamber, if necessary. The pre-clean chamber 228 cleans the substrates before they enter the transfer chamber 202, and the cool-down chamber 230 cools the substrates after they have been processed in the process chambers 204. The pre-clean chamber 228 and the cool-down chamber 230 may also transition the substrates between the vacuum levels of the transfer chamber 202 and the buffer chamber 203. The buffer chamber 203 has two expansion chambers 232 for performing additional processes on the substrates. The buffer chamber 203 may further have an optional cool-down chamber 234 for further cooling the substrates if necessary. A location for an additional chamber 236, such as a substrate alignment chamber or an additional pre-processing or post-processing chamber, is provided on the buffer chamber 203.

The load lock chambers 208 provide controlled transitions of the substrates between the ambient environment pressure to the chamber vacuum pressure. Openings (not shown) in facets 212 provide access and valves provide isolation between the load lock chambers 208 and the buffer chamber 203. Correspondingly, the load lock chambers 208 have openings on their surfaces that align with the openings in facets 212. The load lock chambers 208 and the optional mini-environment 214 have corresponding openings (not shown) providing access therebetween, while doors (not shown) for the openings provide isolation.

Prior to the introduction of 300-mm substrates in the semiconductor processing industry, cassettes of substrates were typically loaded by human operators directly into the load lock chambers 208. Thus, a mini-environment 214 was not present in the system 200. More recently, however, semiconductor fabrication facilities have been including a mini-environment 214 to enter the substrates into the processing system 200 using cassettes of substrates transported by a factory automation handling system to pod loaders 216 attached to a mini-environment 214. The present invention contemplates incorporation in both types of systems 200.

The mini-environment 214 has four pod loaders 216 attached on its front side 238 for receiving substrate cassettes from the factory automation. Openings (not shown) with corresponding doors 226 provide access and isolation between the mini-environment 214 and the pod loaders 216. The pod loaders 216 are mounted on the side of the mini-environment 214 and are essentially shelves for supporting the substrate cassettes, or pods, (not shown) used to transport the substrates to and from the vacuum processing system 200.

A robot 200, or substrate handler, is disposed within the transfer chamber 202 for transferring a substrate 222 between the pre-clean chamber 228 and the cool-down chamber 230 and the process chambers 204. A similar robot 221 is disposed within the buffer chamber 203 for transferring a substrate 223 between the load lock chambers 208, the expansion chambers 232, the cool-down chamber 234, the additional chamber 236, the pre-clean chamber 228 and the cool-down chamber 230. Likewise, a robot 224 is disposed within the mini-environment 214 for transferring the substrates between the pod loaders 216 and the load lock chambers 208. The mini-environment robot 224 is typically mounted on a track so the robot 224 can move back and forth in the mini-environment 214, whereas the transfer and buffer chamber robots 220, 221 are mounted only for rotation.

The process chamber 204 includes an E-chuck having the TE devices and a cold trap gas exhaust according to the invention. Although the invention has been described above with reference to these embodiments, it is understood that the invention is not so limited, but may be used in any number of different applications within a processing system wherein a device, structure or surface needs to be cooled and/or heated to regulate the temperature of the device, structure or surface or to condense particles out of the gases in the processing system.

While foregoing is directed to the preferred embodiment of the present invention, other and further embodiments of the invention may be devised without departing from the basis scope thereof, and the scope thereof is determined by the claims which follow.

We claim:

1. An apparatus for controlling a temperature of a component of a processing system, comprising:
    a) a valve; and
    b) one or more thermoelectric devices, at least one thermoelectric device having a first side disposed in thermal conduction with the valve and a second side disposed in thermal conduction with a thermal fluid outside the valve.

2. The apparatus of claim 1, wherein the valve is an isolation valve.

3. The apparatus of claim 1, wherein the thermoelectric devices further comprise heat sink fins.

4. The apparatus of claim 1, wherein the valve is disposed in a conduit, and at least one thermoelectric device is disposed in the conduit adjacent to the valve.

5. The apparatus of claim 1, wherein the first side of the thermoelectric device contacts a valve paddle.

6. The apparatus of claim 1, wherein the valve is disposed in a conduit, and two thermoelectric devices are disposed in the conduit adjacent the valve.

7. The apparatus of claim 1, further comprising a grid contacting the first side of the thermoelectric device.

8. The apparatus of claim 1, wherein the thermal fluid is a gas.

9. An apparatus for removing particles from a processing chamber, comprising:
    a) a gas exhaust connected to the chamber, the gas exhaust comprising a valve; and
    b) one or more thermoelectric devices disposed on the gas exhaust, wherein at least one of the thermoelectric devices has a cold side disposed within the valve.

10. The apparatus of claim 9, further comprising:
    c) a grid attached to the cold side of the thermoelectric devices.

11. The apparatus of claim 9, further comprising:
    c) one or more heat sink fins attached to the cold side of the thermoelectric devices.

12. A semiconductor processing system, comprising:
    a) a load lock;
    b) a transfer chamber;
    c) one or more processing chambers;
    d) an exhaust valve; and
    e) one or more thermoelectric devices, at least one thermoelectric device having a first side disposed in thermal conduction with the exhaust valve and a second side disposed in thermal conduction with a thermal fluid outside the exhaust valve.

13. The processing system of claim 12, wherein the thermoelectric devices further comprise heat sink fins.

14. The processing system of claim 12, wherein the valve is disposed in a conduit, and a second thermoelectric device is disposed in the conduit adjacent to the valve.

15. The processing system of claim 14, wherein a third thermoelectric device is disposed in the conduit adjacent the valve.

16. The processing system of claim 12, wherein the thermal fluid is a gas.

17. A semiconductor processing system, comprising:
    a) a load lock;
    b) a transfer chamber;
    c) one or more processing chambers;
    d) a gas exhaust connected to the one or more processing chambers, the gas exhaust comprising a valve; and
    e) one or more thermoelectric devices disposed on the gas exhaust, wherein at least one of the thermoelectric devices has a cold side disposed within the valve.

18. The processing system of claim 17, further comprising:
    f) a grid attached to the cold side of the thermoelectric devices.

19. The processing system of claim 17, further comprising:
    f) one or more heat sink fins attached to the cold side of the thermoelectric devices.

20. A method for controlling a temperature of a gas exhaust of a processing chamber, comprising:
    a) providing one or more thermoelectric devices on the gas exhaust, at least one thermoelectric device having a first side disposed in thermal conduction with a valve in the gas exhaust and a second side disposed in thermal conduction with a thermal fluid outside the valve;
    b) supplying electrical power to the thermoelectric devices; and
    c) cooling the second side of the thermoelectric device with the thermal fluid.

21. The method of claim 20, wherein the first side contacts a valve paddle.

22. The method of claim 20, wherein the thermal fluid is a gas.

23. The method of claim 20, wherein the first side contacts a grid.

24. A method for removing particles from a processing chamber, comprising:
    a) providing a gas exhaust connected to the chamber, the gas exhaust comprising a valve;

b) disposing one or more thermoelectric devices on the gas exhaust, wherein at least one of the thermoelectric devices has a cold side disposed within the valve; and c) flowing a gas containing the particles through the gas exhaust.

25. The method of claim 24, further comprising:

d) connecting a grid to the cold side of the thermoelectric devices.

26. The method of claim 24, further comprising:

d) connecting one or more heat sink fins to the cold side of the thermoelectric devices.

27. The apparatus of claim 9, wherein the cold side of the thermoelectric device contacts a valve paddle.

28. The apparatus of claim 9, wherein the valve is an isolation valve.

29. The processing system of claim 12, wherein the valve further comprises a paddle having at least one thermoelectric device mounted thereon.

30. The processing system of claim 12, further comprising:

f) a grid attached to the first side of the thermoelectric devices.

31. The processing system of claim 13, further comprising:

f) heat sink fins attached to the first side of the thermoelectric devices.

* * * * *